US008344825B2

(12) United States Patent
Nishizawa et al.

(10) Patent No.: US 8,344,825 B2
(45) Date of Patent: Jan. 1, 2013

(54) ACOUSTIC WAVE DEVICE

(75) Inventors: Toshio Nishizawa, Yokohama (JP); Go Endo, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 417 days.

(21) Appl. No.: 12/821,025

(22) Filed: Jun. 22, 2010

(65) Prior Publication Data
US 2011/0001581 A1 Jan. 6, 2011

(30) Foreign Application Priority Data
Jul. 1, 2009 (JP) ................................. 2009-157110

(51) Int. Cl.
H03H 9/70 (2006.01)
H03H 9/72 (2006.01)
H03H 9/54 (2006.01)
H03H 9/64 (2006.01)

(52) U.S. Cl. ......... 333/133; 333/189; 333/193; 333/195

(58) Field of Classification Search .................. 333/133, 333/189–195
See application file for complete search history.

(56) References Cited

U.S. PATENT DOCUMENTS

| | | | | |
|---|---|---|---|---|
| 5,936,488 A * | 8/1999 | Taguchi et al. ............... | 333/195 |
| 6,803,835 B2 * | 10/2004 | Frank .............................. | 333/26 |
| 7,102,460 B2 * | 9/2006 | Schmidhammer et al. ... | 333/133 |
| 7,194,247 B2 * | 3/2007 | Tikka et al. .................... | 455/339 |
| 7,199,684 B2 * | 4/2007 | Aigner et al. .................. | 333/189 |
| 7,586,389 B2 * | 9/2009 | Ali-Ahmad et al. .......... | 333/133 |
| 8,063,718 B2 * | 11/2011 | Ueda et al. ..................... | 333/133 |
| 2002/0140526 A1 * | 10/2002 | Nakamura et al. ............ | 333/193 |
| 2003/0112768 A1 * | 6/2003 | Frank ............................. | 370/281 |
| 2003/0174029 A1 * | 9/2003 | Baier et al. .................... | 333/193 |
| 2005/0057325 A1 * | 3/2005 | Kawachi et al. .............. | 333/193 |
| 2006/0284703 A1 * | 12/2006 | Iwasaki et al. ................ | 333/133 |
| 2007/0268092 A1 | 11/2007 | Inoue et al. | |
| 2008/0246552 A1 * | 10/2008 | Shibahara et al. ............. | 333/25 |
| 2010/0052819 A1 * | 3/2010 | Kuroda et al. ................ | 333/193 |

FOREIGN PATENT DOCUMENTS

JP 2007-312324 A 11/2007
WO WO 2009/025056 * 2/2009

OTHER PUBLICATIONS

S.V. Kiselev et al.; "SAW Filters with Combined Single-Mode and Double-Mode Sections"; 2002 IEEE Ultrasonics Symposium Proceedings; vol. 1, pp. 179-183, Oct. 8-11, 2002.*

H.K.J. Ten Dolle et al.; "Balanced Lattice-Ladder Bandpass Filter in Bulk Acoustic Wave Technology"; 2004 IEEE MTT-S International Microwave Symposium Digest; vol. 1, pp. 391-394, Jun. 6-11, 2004.*

\* cited by examiner

*Primary Examiner* — Barbara Summons
(74) *Attorney, Agent, or Firm* — Chen Yoshimura LLP

(57) ABSTRACT

An acoustic wave device includes an input terminal; a balun that is connected to the input terminal, converts a signal input from the input terminal into two anti-phase signals, and outputs the two anti-phase signals; and a filter that is connected to the balun, and outputs the two anti-phase signals input from the balun as balanced output signals. An output impedance of the balun is equal to an input impedance of the filter, and is larger than an output impedance of the filter.

10 Claims, 6 Drawing Sheets

ACOUSTIC WAVE DEVICE

CROSS-REFERENCE TO RELATED APPLICATION

This application is based upon and claims the benefit of priority of the prior Japanese Patent Application No. 2009-157110, filed on Jul. 1, 2009, the entire contents of which are incorporated herein by reference.

FIELD

A certain aspect of the embodiments discussed herein is related to an acoustic wave device.

BACKGROUND

In recent years, filters using a differential (balanced) type signal for a receiving signal are used in wireless communication devices such as cell phones to suppress a common-mode noise in a high-frequency circuit. For example, an Acoustic Wave (AW) device where a circuit combining a balun and ladder-type filters is connected between a balanced terminal and an unbalanced terminal is known as disclosed in Japanese Patent Application Publication No. 2007-312324 (Document 1).

In the acoustic wave device disclosed in Document 1, a filter is directly connected to an input terminal. Thus, an input impedance of the filter is fixed. Therefore, a design flexibility is lost, and it is difficult to downsize the filter.

SUMMARY

The present invention has been made in view of the above mentioned circumstances and provides an acoustic wave device enhancing a design flexibility of a filter including a balun and enabling a downsizing.

According to an aspect of the present invention, there is provided an acoustic wave device including: an input terminal; a balun that is connected to the input terminal, converts a signal input from the input terminal into two anti-phase signals, and outputs the two anti-phase signals; and a filter that is connected to the balun, and outputs the two anti-phase signals input from the balun as balanced output signals. An output impedance of the balun is equal to an input impedance of the filter, and is larger than an output impedance of the filter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present invention are described below with reference to the accompanying drawings.

A description will now be given of an AW device in accordance with a comparative embodiment.

[Comparative Embodiment]

Figure 1:
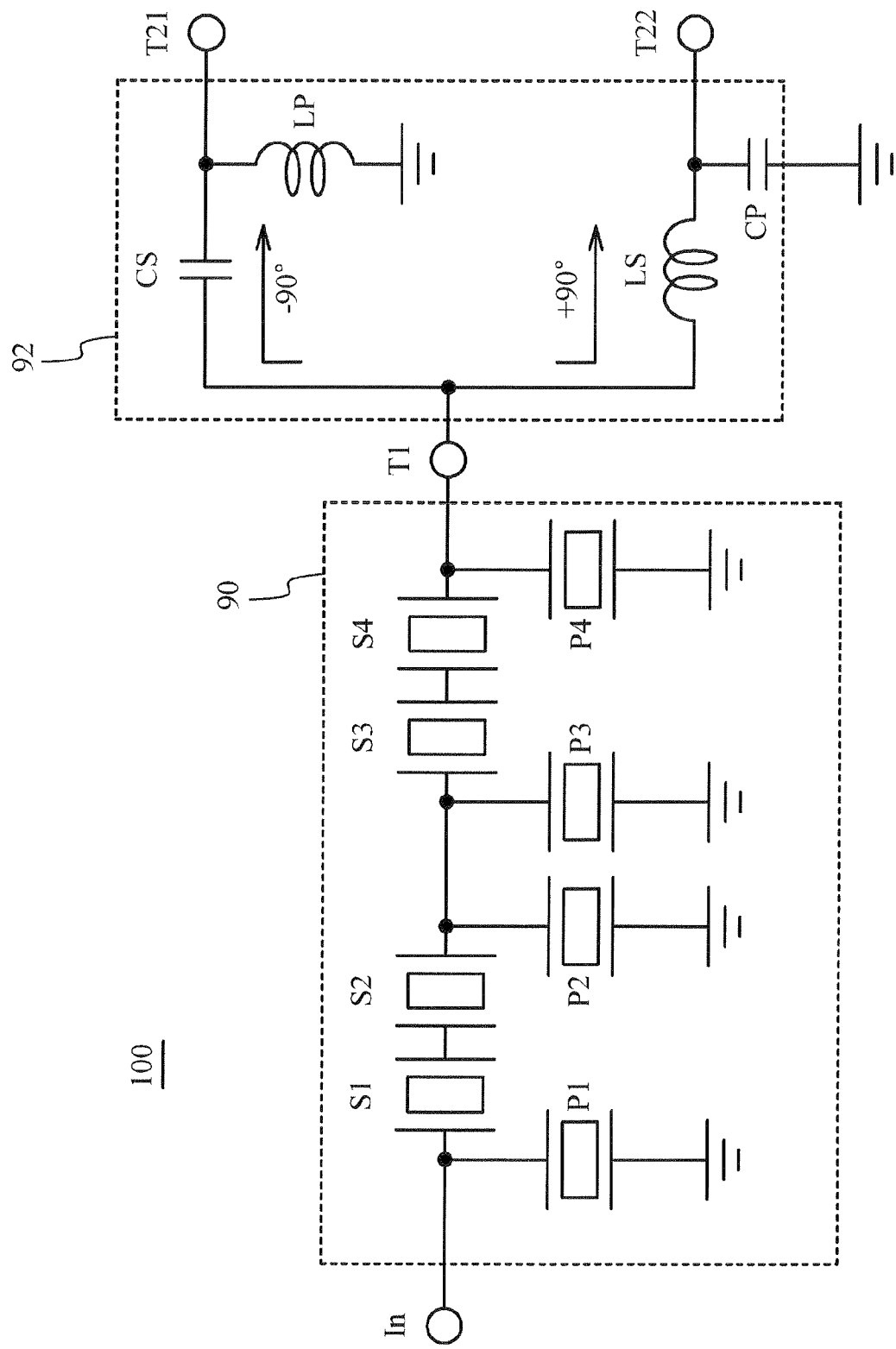
FIG. 1 is a schematic view of an AW device in accordance with a comparative embodiment.

FIG. 1 is a schematic view of an AW device 100 in accordance with the comparative embodiment. The AW device 100 includes one input terminal In and two output terminals T21 and T22. A ladder filter 90 and a balun 92 are connected in series from the input terminal In side between the input terminal In and output terminals T21 and T22. A node locating between the ladder filter 90 and the balun 92 is referred to as a middle node T1.

The ladder filter 90 is connected between the input terminal In and the middle node T1. The ladder filter 90 includes multiple series resonators S1 through S4 connected in series to form a series arm, and multiple parallel resonators P1 through P4 connected in parallel to form a parallel arm. One end of the parallel resonator P1 is connected between the input terminal In and the series resonator S1, and the other end is connected to ground. One end of each of parallel resonators P2 and P3 is connected between series resonators S2 and S3, and the other end is connected to ground. One end of the parallel resonator P4 is connected between the series resonator S4 and the middle node T1, and the other end is connected to ground.

The balun 92 is connected between the middle node T1 and output terminals (T21 and T22). A capacitor CS and an inductor LP are connected between the middle node T1 and the output terminal T21. The capacitor CS is arranged in series in the propagation direction of a signal. The inductor LP is arranged in parallel to the capacitor CS. One end of the inductor LP is connected between the capacitor CS and the output terminal T21, and the other end is connected to ground. A capacitor CP and an inductor LS are connected between the middle node T1 and the output terminal T22. The inductor LS is arranged in series in the propagation direction of a signal. The capacitor CP is arranged in parallel to the inductor LS. One end of the capacitor CP is connected between the inductor LS and the output terminal T22, and the other end is connected to ground.

In the AW device 100, an unbalanced signal is input from the input terminal In. The ladder filter 90 suppresses out-band signal of the input signal. The balun 92 converts the signal passing through the ladder filter 90 into two anti-phase signals, and outputs them as balanced signals. A 90° phase delayed signal is output from the output terminal T21 through the capacitor CS, and a 90° phase advanced signal is output from the output terminal T22 through the inductor LS.

In the AW device 100 in accordance with the comparative embodiment, the balun 92 is connected between the ladder filter 90 and balanced terminals (output terminals T21 and T22). Therefore, the amplitude balance and the phase balance of the AW device 100 as a filter greatly depends on the balun 92. Moreover, since the ladder filter 90 is directly connected to the input terminal In, the input impedance of the ladder filter 90 is fixed and the design flexibility is lost. When the input impedance is fixed, the size of resonators located close to the input side of the ladder filter 90 (e.g. the series resonator S1 and the parallel resonator P1) is fixed. Thus, it is difficult to downsize a device.

In following embodiments, descriptions will be given of AW devices capable of downsizing a filter including a balun and enhancing the design flexibility.

[First Embodiment]

Figure 2:
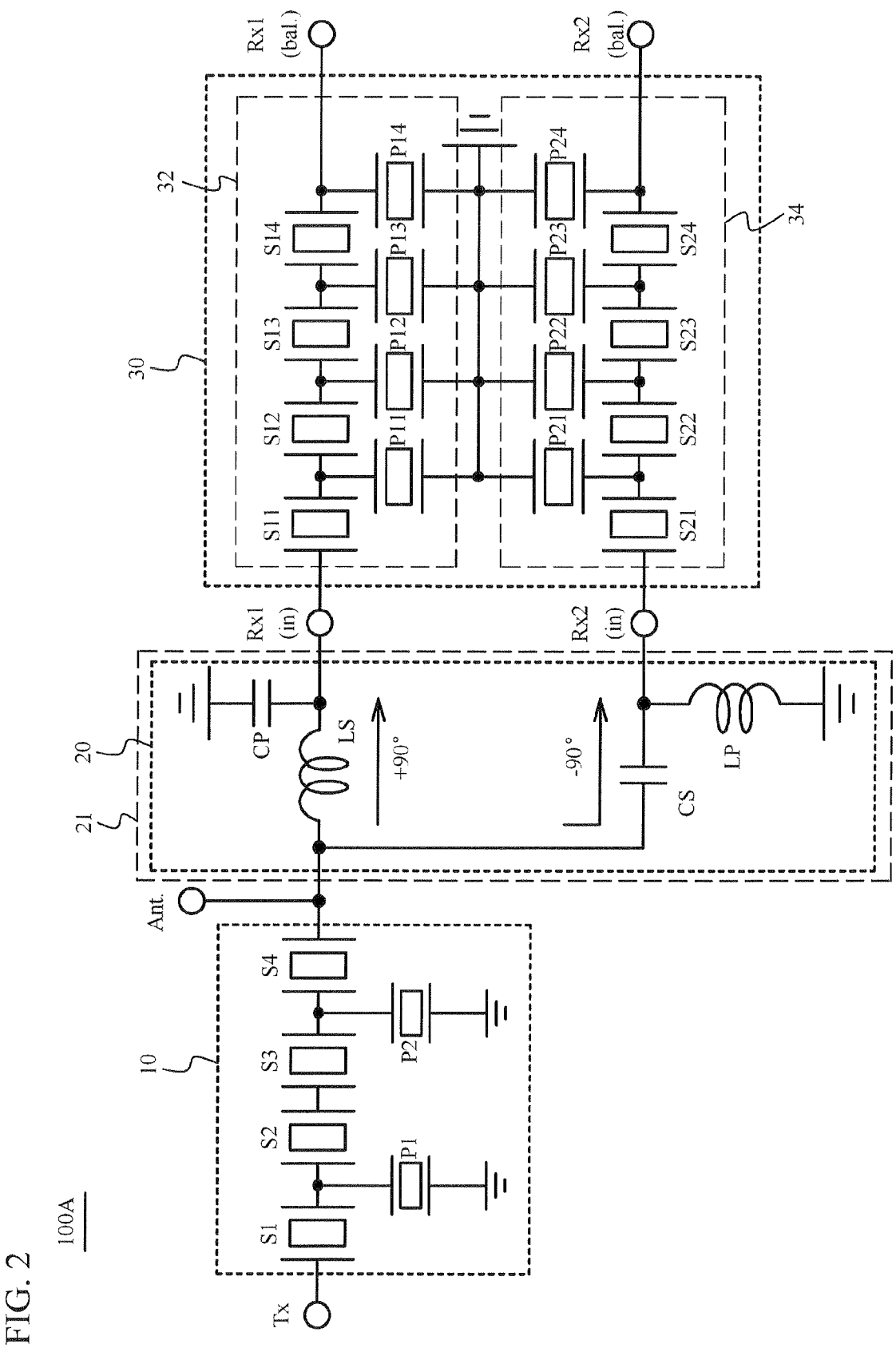
FIG. 2 is a schematic view of an AW device in accordance with a first embodiment.

FIG. 2 is a schematic view of an AW device 100A in accordance with a first embodiment. The AW device 100A includes a common terminal Ant, an input terminal (hereinafter, referred to as a transmission terminal) Tx from the transmission side, and output terminals (hereinafter, referred to as reception terminals) Rx1 and Rx2 to the reception side. A ladder filter 10 is connected between the common terminal Ant and the transmission terminal Tx. A balun 20 and a filter 30 are connected between the common terminal Ant and reception terminals Rx1 and Rx2 in this order from the common terminal Ant side.

The ladder filter 10 has a same configuration as the ladder filter 90 described in the comparative embodiment (FIG. 1), and includes series resonators S1 through S4 and parallel resonators P1 and P2. A description of a detail configuration is omitted.

The balun 20 receives an unbalanced signal from the common terminal Ant, converts it into two anti-phase signals, and outputs them to the filter 30. In nodes locating between the balun 20 and the filter 30, the node from which a 90° phase advanced signal is output is referred to as a middle node Rx1(in), and the node from which a 90° phase delayed signal is output is referred to as a middle node Rx2(in).

The inductor LS and the capacitor CP are connected between the common terminal Ant and the middle node Rx1(in). The inductor LS is arranged in series in the propagation direction of the signal. The capacitor CP is arranged in parallel to the inductor LS. One end of the capacitor CP is connected between the inductor LS and the middle node Rx1(in), and the other end is connected to ground.

The capacitor CS and the inductor LP are connected between the common terminal Ant and the middle node Rx2(in). The capacitor CS is arranged in series in the propagation direction of the signal. The inductor LP is arranged in parallel to the capacitor CS. One end of the inductor LP is connected between the capacitor CS and the middle node Rx2(in), and the other end is connected to ground. Passive devices included in the balun 20 (CS, CP, LS and LP) are formed as an Integrated Passive Device (IPD) 21.

The filter 30 receives two signals from the balun 20, suppresses out-band signals, and outputs suppressed signals to the reception terminal as balanced output signals. In two output terminals of the filter 30, the terminal from which a 90° phase advanced signal is output is referred to as a reception terminal Rx1(bal.), and the terminal from which a 90° phase delayed signal is output is referred to as a reception terminal Rx2(bal.).

The filter 30 is comprised of ladder filters 32 and 34. The ladder filter 32 includes series resonators S11 through S14 connected in series to form a series arm and parallel resonators P11 through P14 connected in parallel to form a parallel arm. The ladder filter 34 includes series resonators S21 through S24 connected in series to form a series arm and parallel resonators P21 through P24 connected in parallel to form a parallel arm. Series resonators S11 through S14 are arranged in series from the middle node Rx1(in) side between the middle node Rx1(in) and the reception terminal Rx1(bal.).

One end of each of parallel resonators P11 through P14 is connected to a node locating between series resonators S11 through S14. More specifically, one end of the parallel resonator P11 is connected between series resonators S11 and S12, one end of the parallel resonator P12 is connected between series resonators S12 and S13, one end of the parallel resonator P13 is connected between series resonators S13 and S14, and one end of the parallel resonator P14 is connected between the series resonator S14 and the reception terminal Rx1(bal.). Relations of connection between series resonators S21 through S24 and parallel resonators P21 through P24 are same as those between series resonators S11 through S14 and parallel resonators P11 through P14.

In parallel resonators P11 through P14 and P21 through P24, ends opposite to ends connected to series resonators are connected to each other, and connected to ground. That is to say that one end of each of parallel resonators P11 through P14 and P21 through P24 is connected to ground in the AW device 100A. A Film Bulk Acoustic Resonator (FBAR) and a Surface Acoustic Wave (SAW) resonator can be used for series resonators S11 through S24 and parallel resonators P11 through P24 for example.

A description will now be given of impedances of the balun 20 and the filter 30. When the input impedance, the output impedance, the central angular frequency, the inductance, and the capacitance of the balun 20 are expressed with Zin, Zout, $\omega_0$, L, and C respectively, relations among these parameters are as follows.

$$L = \sqrt{(Z_{in} \cdot Z_{out})}/\omega_0 \quad \text{(formula 1)}$$

$$C = 1/(\omega_0 \sqrt{Z_{in} \cdot Z_{out}}) \quad \text{(formula 2)}$$

The value of the input impedance Zin depends on the common terminal Ant. In the balun 20, the desired output impedance Zout can be obtained by changing the inductance L and the capacitance C appropriately in response to the arbitrary input impedance Zin.

The input impedance and the output impedance of the filter 30 depend on characteristics of resonators (S11 through S24 and P11 through P24) constructing the filter 30. Especially, the impedance of resonators located close to the input side (series resonators S11 and S21) has a great effect on the input impedance. For example, when resonators are FBARs, it is possible to make the impedance large by making the area of the electrode small. When resonators are SAW resonators, it is possible to make the impedance large by making at least one parameter of an electrode finger pitch, an aperture length, an electrode width, and the number of electrode pairs of an IDT (Interdigital Transducer) small. In both cases, as the impedance becomes larger, the size of resonators becomes smaller.

The impedance of the output side behaves same as that of the input side. As described above, the input and output impedance of the filter 30 can be changed appropriately by changing parameters of resonators.

In this embodiment, the output impedance of the balun 20 is set to be equal to the input impedance of the filter 30. This makes it possible to suppress the mismatch of the impedance between the balun 20 and the filter 30. The output impedance of the filter 30 is set to be smaller than the output impedance of the balun 20 (and the input impedance of the filter 30). The magnitude relation between these impedances can be achieved by changing the output impedance of the balun 20 and the input and output impedance of the filter 30 appropriately by the method described above.

For example, when the input impedance of the balun 20 is 50Ω and the output impedance of the filter 30 is 100Ω (50Ω unbalanced input-100Ω balanced output), it is possible to make the output impedance of the balun 20 and the input impedance of the filter 30 larger than 100Ω (e.g. 200Ω). It is preferable that the output impedance of the balun 20 and the input impedance of the filter 30 are larger than the output impedance of the filter 30 by over 25%. The more preferable is over 50%, and the further preferable is over 100%.

According to the AW device 100A of the first embodiment, the balun 20 is connected between the common terminal Ant and the filter 30. This makes it possible to adjust the amplitude balance and the phase balance of the AW device 100A as a filter by the filter 30, and to reduce the dependence on the balun 20. Since the filter 30 is connected to the output end of the balun 20, the input impedance of the filter 30 can be set arbitrary by the balun 20, and the design flexibility can be enhanced.

Especially, it is possible to make the value of input impedance of the filter 30 large by making the output impedance of the balun 20 equal to the input impedance of the filter 30, and larger than the output impedance of the filter 30. Since this makes it possible to make the size of resonators located close to the input side of the filter (series resonators S11 and S21) small, it becomes possible to downsize the whole of the AW device 100A.

[Second Embodiment]

Figure 3:
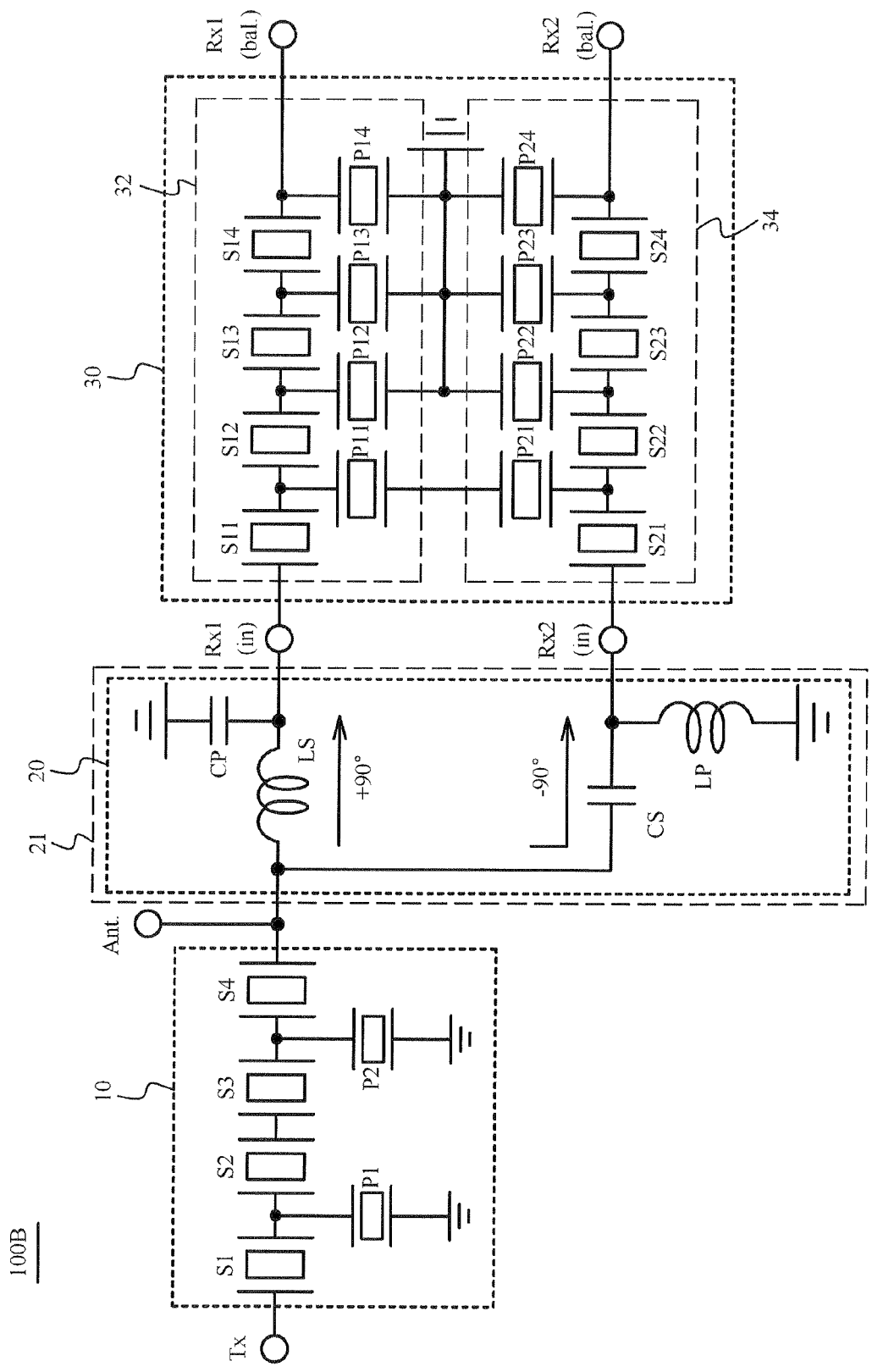
FIG. 3 is a schematic view of an AW device in accordance with a second embodiment.

FIG. 3 is a schematic view of an AW device 100B in accordance with a second embodiment. In ladder filters 32 and 34 constructing the filter 30, one end of each of parallel resonators P11 and P21 located closest to the input side is connected to each other, but is not connected to ground. Other configurations are same as those of the first embodiment (FIG. 2), and detail descriptions are omitted. The relation between input and output impedances of the balun 20 and the filter 30 is same as that of the first embodiment.

According to the AW device 100B in accordance with the second embodiment, although parallel resonators P11 and P21 are not connected to ground, filter characteristics which is almost same as that of the AW device 100A in accordance with the first embodiment can be achieved. This is because whether or not parallel resonators P11 and P21 are connected to ground has a small effect on filter characteristics in parallel resonators P11 and P21 located close to the input side (away from the output side) of the filter 30. This will be described in detail in a third embodiment. According to the AW device 100B, since it is not necessary to provide a ground pad to connect parallel resonators P11 and P21 to the ground, it is possible to downsize the filter and the whole of the device compared to the first embodiment.

[Third Embodiment]

Figure 4:
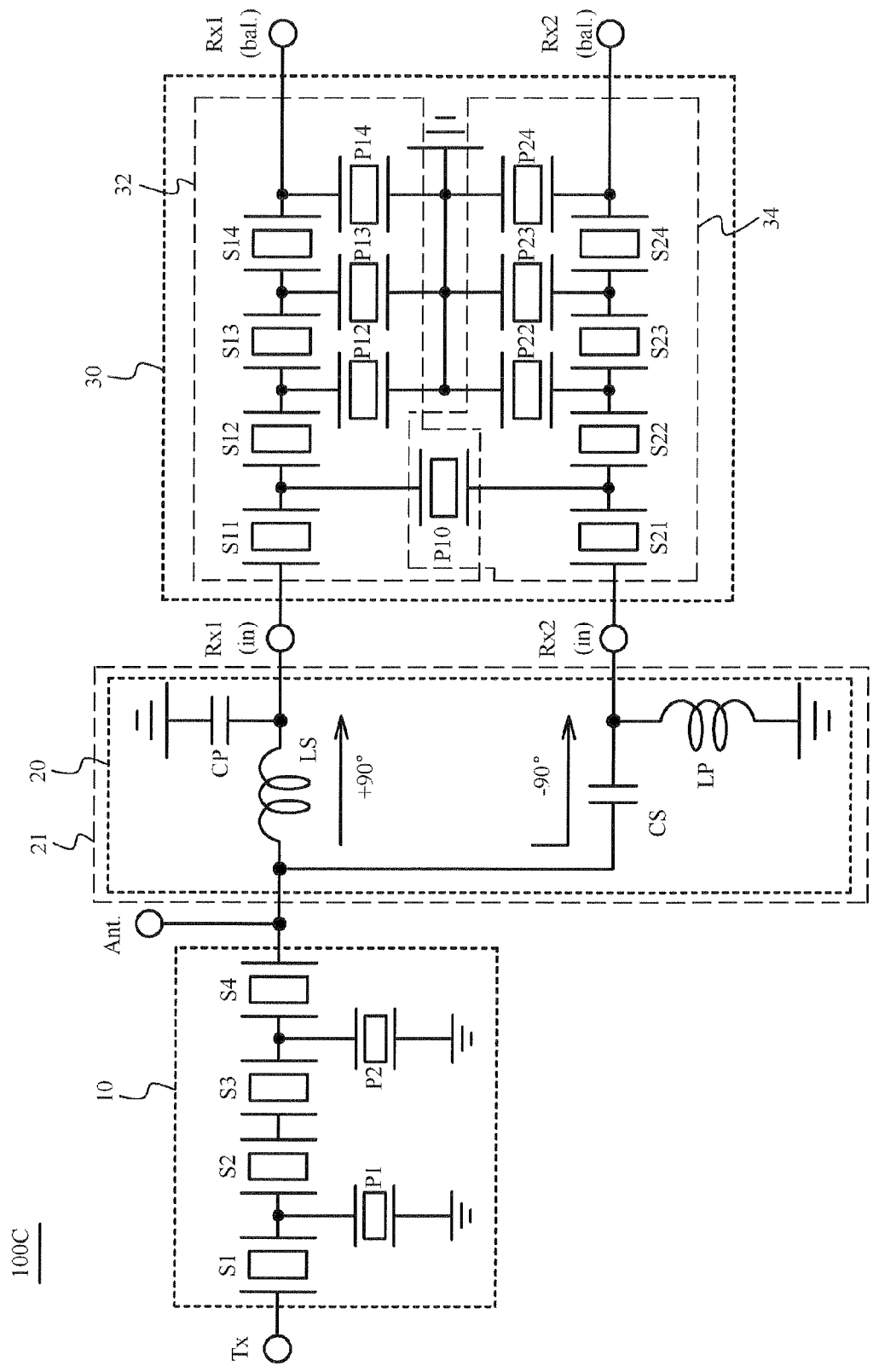
FIG. 4 is a schematic view of an AW device in accordance with a third embodiment.

FIG. 4 is a schematic view of an AW device 100C in accordance with the third embodiment. In ladder filters 32 and 34 constructing the filter 30, a parallel resonator located closest to the input side is a parallel resonator P10 which is common to ladder filters 32 and 34, and is not connected to ground. That is to say that parallel resonators P11 and P21 in the second embodiment (FIG. 3) are combined into the one parallel resonator P10, one end of the parallel resonator P10 is connected between series resonators S11 and S12, and the other end is connected between series resonators S21 and S22. Other configurations are same as those of the second embodiment (FIG. 3), and detail descriptions are omitted. The relation between input and output impedances of the balun 20 and the filter 30 is same as that of first and second embodiments.

Figure 5:
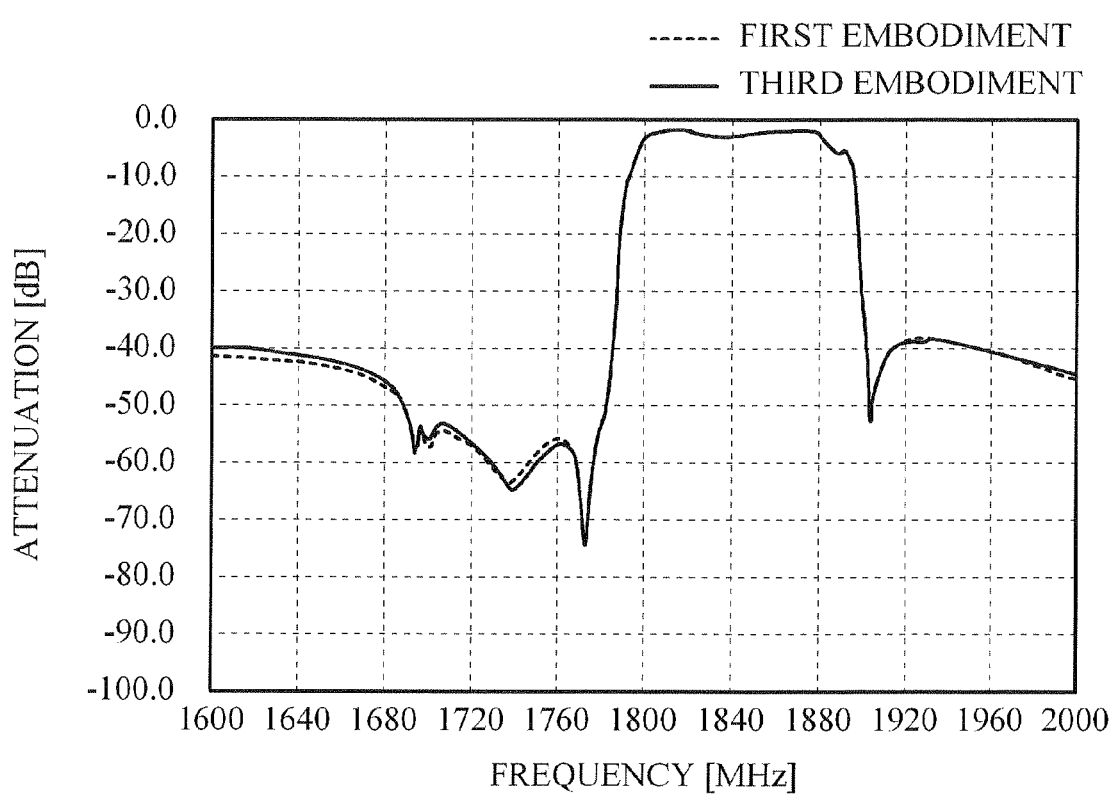
FIG. 5 is a graph indicating characteristics of AW devices in accordance with first and third embodiments.

FIG. 5 is a graph illustrating a comparison of characteristics of the reception side between the AW device 100C in accordance with the third embodiment and the AW device 100A in accordance with the first embodiment. A simulation is carried out under the condition that the pass band is Band3 (Tx:1710 through 1785 MHz, and Rx:1805 through 1880 MHz) and resonators are FBARs.

As illustrated in FIG. 5, there is little difference in attenuations of in-band signal and out-band signal between the first embodiment and the third embodiment. However, in the AW device 100C of the third embodiment, it is not necessary to provide the ground pad to connect parallel resonators P11 and P21 to the ground. Therefore, it is possible to downsize the filter 30 and the whole of the device compared to the first embodiment. Since parallel resonators P11 and P21 are combined into one parallel resonator P10, it is possible to further downsize the filter 30 and the whole of the device compared to first and second embodiments.

In first through third embodiments, circuit configurations of ladder filters 32 and 34 included in the filter 30 may be same as each other, or may be different from each other. The balance performance of the filter including the balun can be improved by making circuit configurations of ladder filters different from each other. For example, when at least one of the type of elements, the number of elements, and the relation of connection between elements constructing two circuits is different from each other, it may be said that circuit configurations are different. When composition elements of circuits and relations of connection between elements are same, but electric characteristics such as a capacitance value and a resistance value or specific configurations such as a shape and size of electrode of each composition element are different from each other, it may be also said that circuit configurations are different. In first through third embodiments, it is preferable that these parameters are different from each other.

In first through third embodiment, parallel resonators (P12 through P14 and P22 through P24) other than parallel resonators closest to the input side are always connected to ground. However, it may be possible that some of these parallel resonators are not connected to ground. It is determined by the electric characteristics of AW devices 100A through 100C whether parallel resonators are connected. However, it is preferable that parallel resonators (P14 and P24) closest to the output side are connected to ground. The numbers of series resonators and parallel resonators included in each ladder filter are not limited to four that is the number in above embodiments.

[Fourth Embodiment]

A fourth embodiment is an example using a DMS filter instead of the ladder filter.

Figure 6:
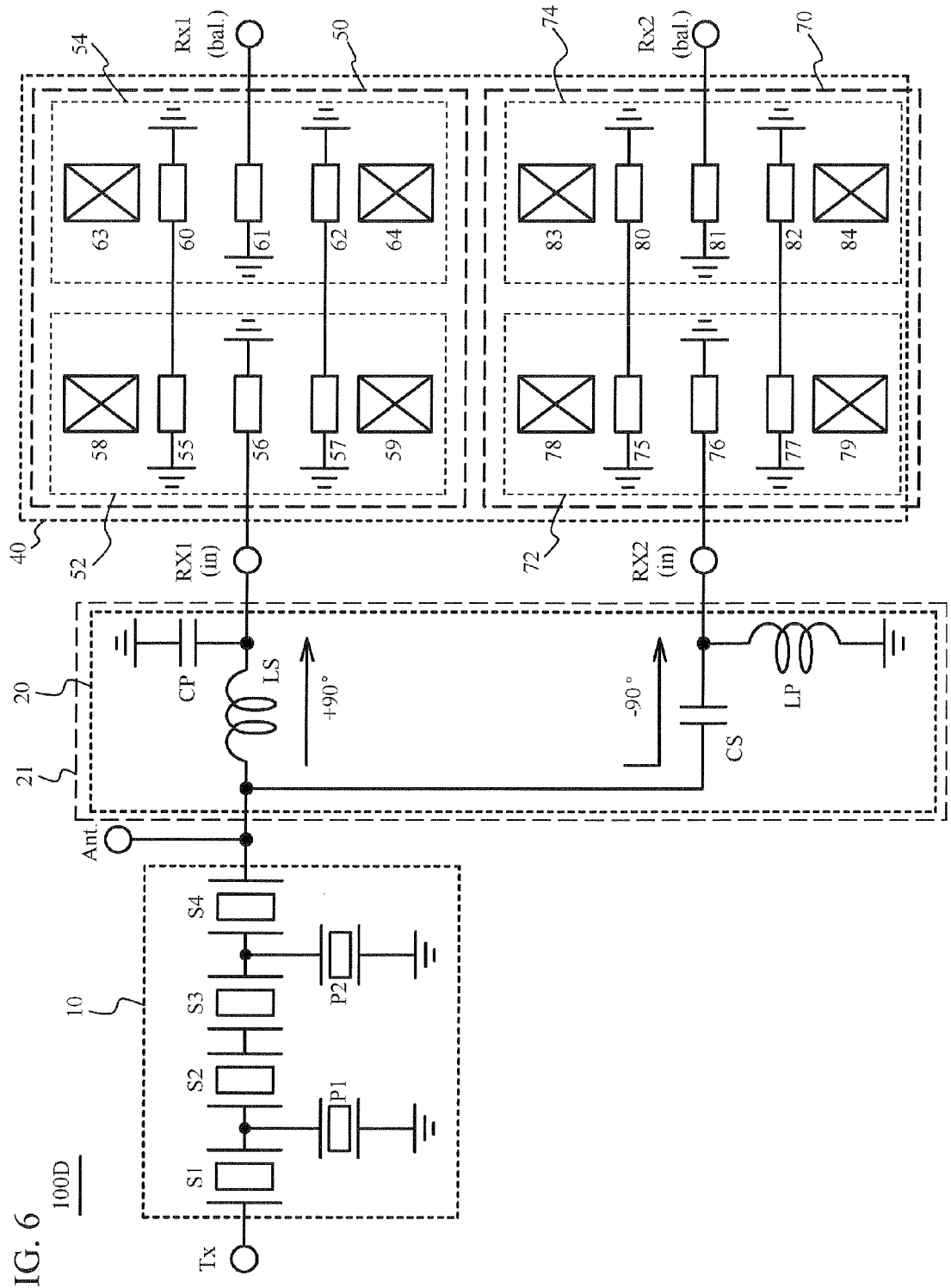
FIG. 6 is a schematic view of an AW device in accordance with a fourth embodiment.

FIG. 6 is a schematic view of an AW device 100D in accordance with the fourth embodiment. As the arrangement of each terminal, and configurations of the ladder filter 10 and the balun 20 are same as those of first through third embodiments, detail descriptions are omitted. In the fourth embodiment, a DMS (Double Mode SAW) filter 40 is arranged between the balun 20 and reception terminals Rx1(bal.) and Rx2(bal.) instead of the filter 30. The relation between input and output impedances of the balun 20 and the DMS filter 40 is same as that of the first embodiment.

The DMS filter 40 includes a filter 50 connected between the middle node Rx1(in) and the reception terminal Rx 1(bal.), and a filter 70 connected between the middle node Rx2(in) and the reception terminal Rx2(bal.). The filter 50 is comprised of DMS filters 52 and 54 connected in series. The DMS filter 52 includes three IDTs 55 through 57 arranged in the propagation direction of the surface acoustic wave, and a pair of reflectors 58 and 59 located on either side of IDTs. The DMS filter 54 includes three IDTs 60 through 62 arranged in the propagation direction of the surface acoustic wave, and a pair of reflectors 63 and 64 located on either side of IDTs.

In the DMS filter 52 locating at the input side, the IDT 56 locating at the center functions as an input IDT, and IDTs locating on either side of the IDT 56 function as an output IDT. The input IDT 56 of the DMS filter 52 locating at the input side is connected to the middle node Rx1(in). In the DMS filter 54 locating at the output side, the IDT 61 locating at the center functions as an output IDT, and IDTs locating on either side of the IDT 61 function as an input IDT. Input IDTs 60 and 62 of the DMS filter 54 locating at the output side are connected to output IDTs 55 and 57 of the DMS filter 52 locating at the output side respectively. The output IDT 61 of the DMS filter 54 locating at the output side is connected to the reception terminal Rx1(bal.).

The configuration of the filter 70 connected to the middle node Rx2(in) is same as that of the filter 50. The filter 70 is comprised of DMS filters 72 and 74 connected in series. The DMS filter 72 includes three IDTs 75 through 77 arranged in the propagation direction of the surface acoustic wave, and a pair of reflectors 78 and 79 located on either side of IDTs. The DMS filter 74 includes three IDTs 80 through 82) arranged in the propagation direction of the surface acoustic wave, and a pair of reflectors 83 and 84 located on either side of IDTs.

In the AW device 100D in accordance with the fourth embodiment, the DMS filter 40 is used as a filter. When at least one parameter of an electrode finger pitch, an aperture length, an electrode width, and the number of electrode pairs of IDTs (55 through 57, and 75 through 77) locating at the input side of the DMS filter 40 is set to be smaller than the output side, it is possible to make the input impedance of the DMS filter 40 larger than the output impedance.

According to the AW device 100D in accordance with the fourth embodiment, it is possible to change the input impedance of the DMS filter 40 and enhance the design flexibility by connecting the balun between the common terminal Ant and the DMS filter 40. In addition, it is possible to downsize the DMS filter 40 and the whole of the device by downsizing the IDT locating at the input side of the DMS filter 40 by making the output impedance of the balun 20 equal to the input impedance of the DMS filter 40 and larger than the output impedance of the DMS filter 40.

In first through fourth embodiments, descriptions are given by using a duplexer including the ladder filter 10 at the transmission side as an example. However, it is not necessary that AW devices 100A through 100D include the ladder filter 10. In this case, the common terminal Ant becomes the input terminal In as same with the comparative embodiment.

In first through fourth embodiments, the balun 20 is comprised of the IPD 21, but can be comprised by methods other than the IPD. However, it is possible to downsize AW devices 100A through 100D further by using the IPD as described in first through fourth embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An acoustic wave device comprising:
    an input terminal;
    a balun that is connected to the input terminal, converts a signal input from the input terminal into two anti-phase signals, and outputs the two anti-phase signals; and
    a filter that is connected to the balun, and outputs the two anti-phase signals input from the balun as balanced output signals;
    wherein an output impedance of the balun is equal to an input impedance of the filter, and is larger than an output impedance of the filter.

2. The acoustic wave device according to claim 1, wherein the filter is comprised of first and second ladder filters; and
    each of the first and second ladder filters includes series resonators and parallel resonators.

3. The acoustic wave device according to claim 2, wherein the first ladder filter and the second ladder filter have one parallel resonator that is common to the first and second ladder filters and is not connected to ground, the one parallel resonator being one of the parallel resonators included in each of the first and second ladder filters and being arranged in a parallel arm of the first and second ladder filters closest to input sides thereof; and
    one end of each of other parallel resonators out of the parallel resonators in the first ladder filter and one end of each of other parallel resonators out of the parallel resonators in the second ladder filter are connected to each other, and are connected to ground.

4. The acoustic wave device according to claim 2, wherein one end of a parallel resonator of the first ladder filter, which is one of the parallel resonators and arranged in a parallel arm of the first ladder filter closest to an input side thereof, and one end of a parallel resonator of the second ladder filter, which is one of the parallel resonators and arranged in a parallel arm of the second alder filter closest to an input side thereof, are connected to each other but are not connected to ground, and
    one end of each of other parallel resonators out of the parallel resonators included in the first ladder filter and one end of each of other parallel resonators out of the parallel resonators included in the second ladder filter are connected to each other, and are connected to ground.

5. The acoustic wave device according to claim 2, one end of each of the parallel resonators is connected to ground.

6. The acoustic wave device according to claim 2, the first ladder filter has a different circuit configuration from the second ladder filter.

7. The acoustic wave device according to claim 2, at least some of the series resonators and the parallel resonators are a surface acoustic wave resonator or a film bulk acoustic resonator.

8. The acoustic wave device according to claim 1, wherein the filter is comprised of a Double Mode SAW (DMS) filter.

9. The acoustic wave device according to claim 1, wherein the input terminal is a common terminal, and
    the acoustic wave device is a duplexer including a filter connected to the common terminal.

10. The acoustic wave device according to claim 1, wherein the balun is comprised of an Integrated Passive Device (IPD).

* * * * *